(12) United States Patent
Shen

(10) Patent No.: US 8,405,114 B2
(45) Date of Patent: Mar. 26, 2013

(54) LIGHT-EMITTING DIODE DIE PACKAGE AND METHOD FOR PRODUCING SAME

(75) Inventor: Yu-Nung Shen, Taipei (TW)

(73) Assignee: Evergrand Holdings Limited, Tortola (VG)

( * ) Notice: Subject to any disclaimer, the term of this patent is extended or adjusted under 35 U.S.C. 154(b) by 0 days.

(21) Appl. No.: 13/413,453

(22) Filed: Mar. 6, 2012

(65) Prior Publication Data

US 2012/0161189 A1 Jun. 28, 2012

Related U.S. Application Data

(63) Continuation of application No. 12/700,062, filed on Feb. 4, 2010, now Pat. No. 8,242,517.

(30) Foreign Application Priority Data

Feb. 6, 2009 (TW) ................................ 98104011 A

(51) Int. Cl.
*H01L 33/00* (2010.01)
*H01L 33/42* (2010.01)

(52) U.S. Cl. ..................... 257/98; 257/84; 257/E33.058; 257/E33.056; 257/88

(58) Field of Classification Search .................... 257/13, 257/79–103, 918, E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 2005/0173708 A1* | 8/2005 | Suehiro et al. | 257/79 |
| 2007/0166853 A1* | 7/2007 | Guenther et al. | 438/26 |
| 2009/0101930 A1* | 4/2009 | Li | 257/98 |
| 2009/0166653 A1* | 7/2009 | Weaver et al. | 257/98 |
| 2009/0166665 A1* | 7/2009 | Haitko | 257/100 |
| 2009/0261365 A1* | 10/2009 | Brunner et al. | 257/98 |
| 2009/0262526 A1* | 10/2009 | Lin et al. | 362/231 |
| 2010/0118511 A1* | 5/2010 | Wegat | 362/84 |
| 2010/0140551 A1* | 6/2010 | Parce et al. | 252/301.36 |
| 2010/0187961 A1* | 7/2010 | Scott | 313/1 |

* cited by examiner

Primary Examiner — Mamadou Diallo
(74) Attorney, Agent, or Firm — Jackson IPG PLLC

(57) ABSTRACT

The present invention relates to a light-emitting diode die package having an LED die and an accommodating housing. The LED die has a first doped layer doped with a p- or n-type dopant and a second doped layer doped with a different dopant from that doped in the first doped layer. Each of the first and second doped layers has an electrode-forming surface formed with an electrode, on which an insulation layer is formed. The insulation layer is formed with exposure holes for exposing the electrodes corresponding thereto. Each of the exposure holes is formed inside with an electrically conductive linker. The accommodating housing has an open end through which an accommodating space is accessible. The LED die is positioned within the accommodating space in such a manner that the electrically conductive linker protrudes outwardly from the accommodating space.

1 Claim, 5 Drawing Sheets bin 1                                    bin 128 ved an LED die
LIGHT-EMITTING DIODE DIE PACKAGE AND METHOD FOR PRODUCING SAME

CROSS-REFERENCE TO RELATED APPLICATION

This application is a continuation application of U.S. Ser. No. 12/700,062, filed Feb. 4, 2010, now U.S. Pat. No. 8,242,517 the disclosure of which is incorporated herein by reference in its entirety.

BACKGROUND OF THE INVENTION

1. Field of the Invention

The present invention relates to a light-emitting diode (LED) die package and a method for producing the same, and more particularly, to an LED die package and a method for producing the same with a reduced bin number.

2. Description of the Prior Art

FIG. 8 is a schematic side view of a conventional LED package. FIG. 9 is a schematic diagram showing a bin distribution of LED chips after packaging, in which the light emitted from the LED chips have the same wavelength and the same brightness.

Referring to FIG. 8, the conventional LED package includes an LED chip 91 disposed on a lead frame 90, and a lens 92 formed on the lead frame 90 in a manner covering the LED chip 91.

The electrodes (not shown) of the LED chip 91 are connected electrically to the corresponding legs 900 of the lead frame 90 via wires 93.

It should be noted that a phosphor layer 94 is formed on an electrode-side surface of the LED chip 91. The formation of the layer 94 is achieved by the following steps: coating the electrode-side surface of the LED chip 91 with liquid phosphor layer material and curing the liquid phosphor layer material by a baking process so as to form the phosphor layer 94.

However, the convention process for formation of the phosphor layer 94 has the following drawbacks:

1. Uneven thickness—flowing of the liquid phosphor layer material in all directions may occur before performing the baking process and, therefore, the respective phosphor layers 94 formed on the respective LED chips 91 will differ in thickness.

2. Different area—due to the same reason as mentioned in point 1 above, the areas of the respective phosphor layers 94 formed on the respective LED chips 91 will be different.

3. Different shape—due to the same reason as mentioned in point 1 above, the respective phosphor layers 94 formed on the respective LED chips 91 will differ in shape.

4. Relative position offset—due to the same reason as mentioned in point 1 above, the positions of the respective phosphor layers 94 formed on the respective LED chips 91 relative to the corresponding LED chips 91 will be different.

Due to the aforesaid drawbacks, the LED chips which originally emit light with the same wavelength and the same brightness would be unfavorably fabricated into LED chip packages that show a broad variety in terms of color temperature, brightness and wavelength, resulting in the so-called side bins. Referring to FIG. 9 that shows a bin distribution resulted from the drawbacks described above, it should be noted that the LED chips sorted into the same bin will be divided into 128 bins after the packaging process. Normally, only the central 60% of the packages in the distribution are adapted for subsequent use, and the rest 40% are considered as side bins. As a result, the manufacture cost is increased.

Moreover, since the cross-sectional area of the wire 93 is so small that the heat generated by the LED chip 91 can hardly dissipate to the surroundings through the legs 900 of the lead frame 90, the heat would consequently reduce the efficiency of the LED chip package.

In view of the above, the inventor has devised an LED die package, as well as a method for producing the same, to fulfill the need in this respect.

SUMMARY OF THE INVENTION

Accordingly, an object of the invention is to provide an LED die package and a method for producing the same.

In order to achieve this object, a light-emitting diode die package according to a technical feature of the invention is provided, which comprises a light-emitting diode die and a generally basin-shaped rectangular accommodating housing. The light-emitting diode die has a first doped layer doped with a p- or n-type dopant and a second doped layer doped with a different dopant from that doped in the first doped layer and disposed on the first doped layer. Each of the second doped layer and the first doped layer has an electrode-forming surface formed with an electrode, on which an insulation layer is formed. The insulation layer is formed with a plurality of exposure holes for exposing the electrodes corresponding thereto. Each of the exposure holes is formed inside with an electrically conductive linker for electrically connecting the electrodes to external circuit components. The accommodating housing is made of an insulative transparent material doped with phosphor powder and has an open end through which an accommodating space is accessible. The light-emitting diode die is positioned within the accommodating space of the housing in such a manner that the electrically conductive linker protrudes outwardly from the accommodating space.

According to another technical feature of the invention, a method for producing a light-emitting diode die package is provided, which comprises providing at least one light-emitting diode die which has a first doped layer doped with a p- or n-type dopant and a second doped layer doped with a different dopant from that doped in the first doped layer and disposed on the first doped layer, wherein each of the second doped layer and the first doped layer has an electrode-forming surface formed with an electrode, on which an insulation layer is formed, and wherein the insulation layer is formed with a plurality of exposure holes for exposing the electrodes corresponding thereto, and wherein each of the exposure holes is formed inside with an electrically conductive linker for electrically connecting the electrodes to external circuit components; and providing a generally basin-shaped rectangular accommodating housing made of an insulative transparent material doped with phosphor powder, the housing having an open end through which a plurality of accommodating spaces are accessible, wherein the light-emitting diode die is positioned within the corresponding accommodating space of the housing in such a manner that the electrically conductive linker protrudes outwardly from the accommodating space; and subjecting the housing to a dicing process, so as to obtain an individual light-emitting diode die package.

According to still another technical feature of the invention, a light-emitting diode die package is provided, which comprises a light-emitting diode die having a first doped layer doped with a p- or n-type dopant and a second doped layer doped with a different dopant from that doped in the first doped layer and disposed on the first doped layer, wherein each of the second doped layer and the first doped layer has an electrode-forming surface formed with an electrode, on which a buffer layer is formed, and wherein the buffer layer is formed with a plurality of through holes for exposing the electrodes corresponding thereto; an insulation layer formed on the buffer layer, wherein the insulation layer is formed with a plurality of exposure holes, each being registered with the through holes corresponding thereto, and at least one via hole for exposing a portion of the buffer layer that is exposed by the through holes, and wherein the through holes and the exposure holes are each formed inside with an electrically conductive linker; and a generally basin-shaped rectangular accommodating housing made of an insulative transparent material doped with phosphor powder, the housing having an open end through which an accommodating space is accessible, wherein the light-emitting diode die is positioned within the accommodating space of the housing in such a manner that the electrically conductive linker protrudes outwardly from the accommodating space.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
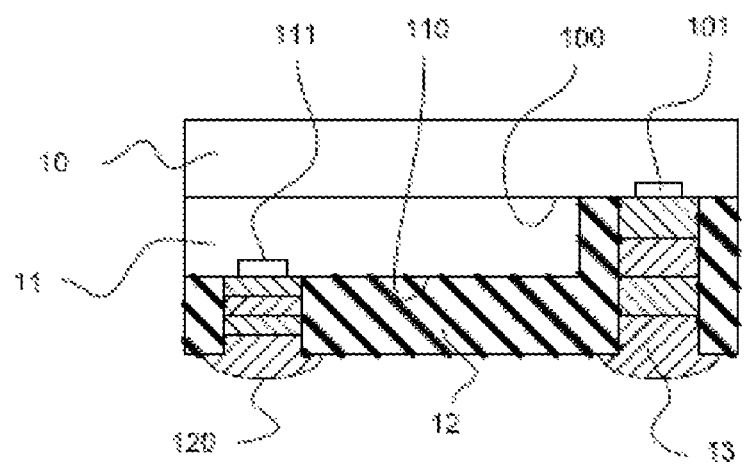
FIGS. 1-6 are schematic diagrams illustrating a method for producing an LED die package according to a preferred embodiment of the invention.
Figure 2:
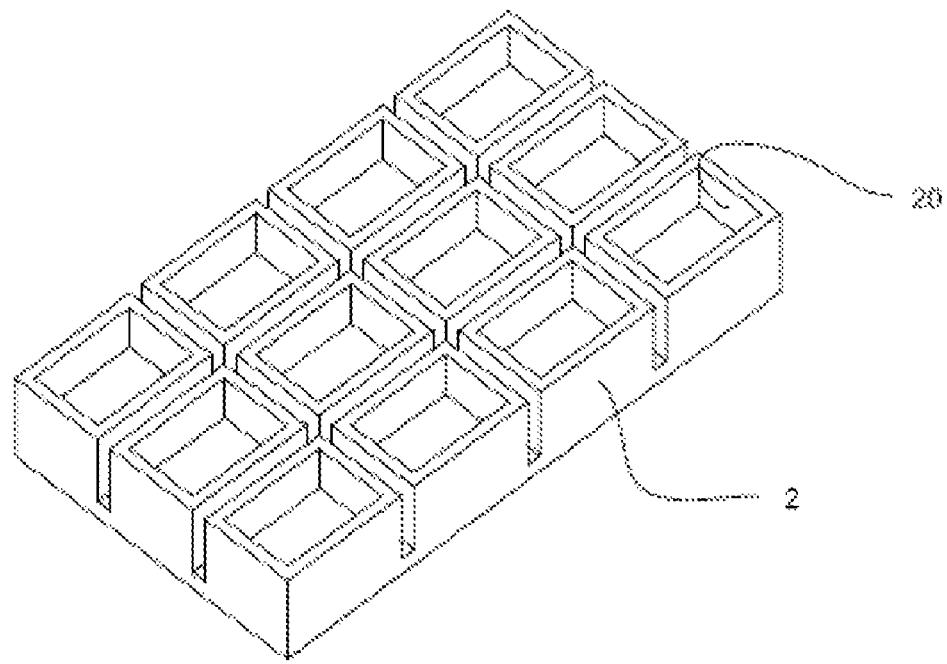
Figure 3:
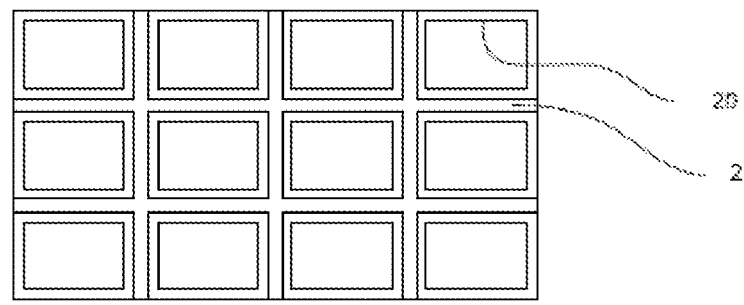
Figure 4:
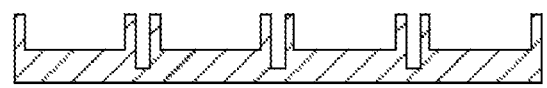

Before the present invention is described in greater detail, it should be noted that the same or like elements are denoted by the same reference numerals throughout the disclosure. Moreover, the elements shown in the drawings are not illustrated in actual scale, but are expressly illustrated to explain in an intuitive manner the technical feature of the invention disclosed herein.

FIGS. 1-6 are schematic diagrams illustrating a method for producing an LED die package according to a preferred embodiment of the invention.

Referring to FIGS. 1-6, a plurality of light-emitting diode (LED) dies are first provided, each having a first doped layer 10 doped with a p- or n-type dopant and a second doped layer 11 doped with a different dopant from that doped in the first doped layer 10 and disposed on the first doped layer 10 (For illustrative purpose, FIG. 1 only shows a single LED die).

The second doped layer 11 and the first doped layer 10 have electrode-forming surfaces 110,100 formed with electrodes 111,101, on which an insulation layer 12 is formed. The insulation layer 12 is formed with several exposure holes 120 for exposing corresponding electrodes 101,111. Each of the exposure holes 120 is formed inside with an electrically conductive linker 13 for electrically connecting the electrodes 101,111 to external circuit components (not shown). Each of the electrically conductive linker 13 can be made of four metal layers, such as a combination of a chromium layer, a copper layer, a nickel layer and a gold layer, a combination of a silver layer, a copper layer, a nickel layer and a gold layer, or a combination of a chromium layer, a diamond-graphite film layer, a copper layer and a tin layer.

It should be noted that the insulation layer 12 is made of a photosensitive material, preferably a transparent photosensitive material doped with phosphor powder.

Next, a generally basin-shaped rectangular accommodating housing 2 is provided, which is made of insulative transparent material doped with phosphor powder. The housing 2 can be manufactured by any suitable process, such as by a molding process, so as to have an open end through which a plurality of equal sized accommodating spaces 20 are accessible.

It should be understood that the phosphor powder doped in the materials that constitute the insulation layer 12 and the housing 2 may be independently a phosphor powder of any color or any combination of colors, depending on actual need.

The LED die, which is provided with electrically conductive linkers 13 as shown in FIG. 1, is positioned within a corresponding accommodating space 20 of the housing 2 in such a manner that the electrically conductive linker 13 protrudes outwardly from the accommodating space 20. The LED die provided with electrically conductive linkers 13 can be secured within the accommodating space 20 by any suitable process. According to this embodiment, the LED die is fixed to the accommodating space 20 by applying a transparent adhesive layer (not shown) between the LED die and inner walls of the accommodating space 20.

Figure 5:
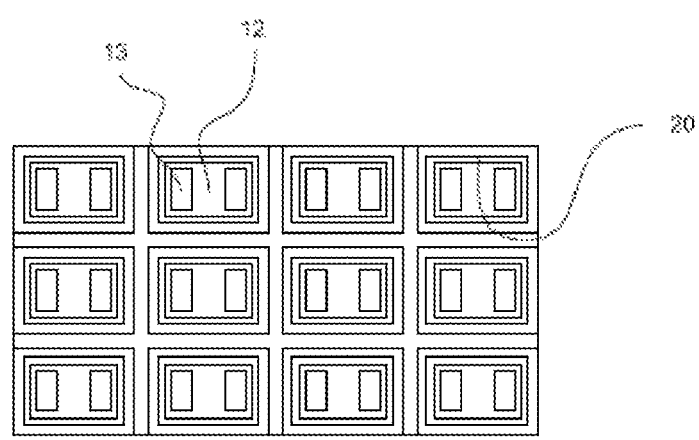

After the respective LED dies are placed into the accommodating spaces 20 corresponding thereto, the housing 2 is subjected to a dicing process, so as to obtain an LED die package 1 covered with a phosphor layer 2' as shown in FIG. 5. Since the respective phosphor layers 2' of the LED dies packages 1 are of the same shape and thickness, the phosphor powder will generate light with the same color temperature and brightness by being excited by the blue light emitted from the LED chips. Therefore, the conventional problem of producing 40% side bins caused by application of phosphor powder during the LED packaging process is solved. Moreover, the position of the phosphor layer 2' relative to the LED chip will not offset. The invention effectively overcomes the drawbacks present in the conventional LED packages accordingly.

It should be noted that the housing 2 may be diced during the dicing process in such manner that a single LED die package contains a plurality of LED dies.

Figure 7:
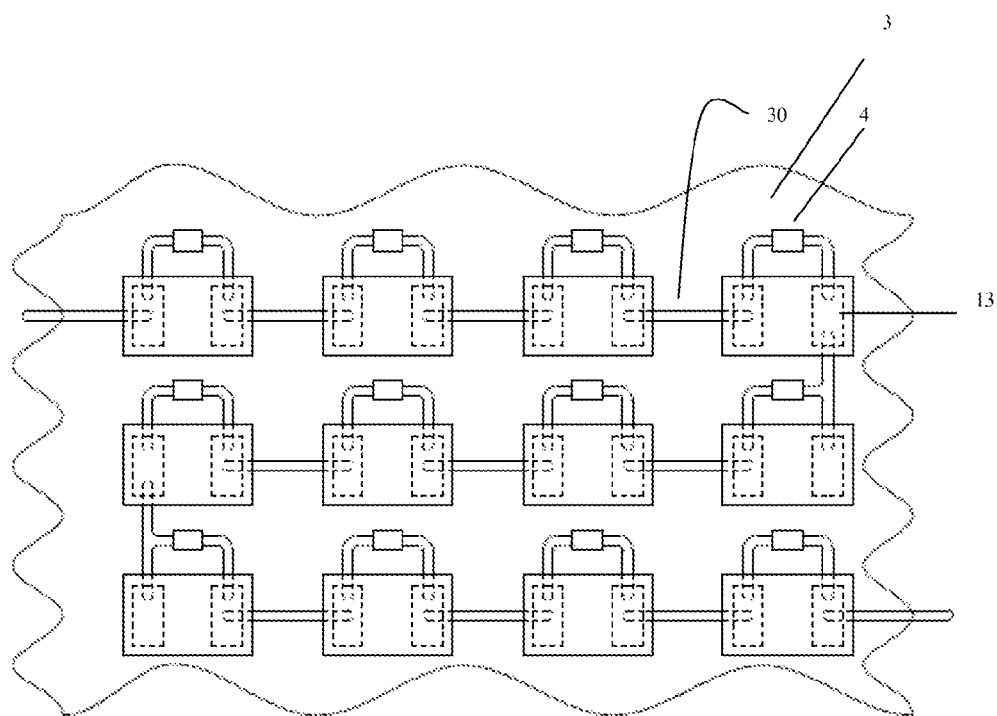
FIG. 7 is a schematic top partial view of a printed circuit board on which an LED die package provided with a plurality of LED dies is mounted.
Figure 8:
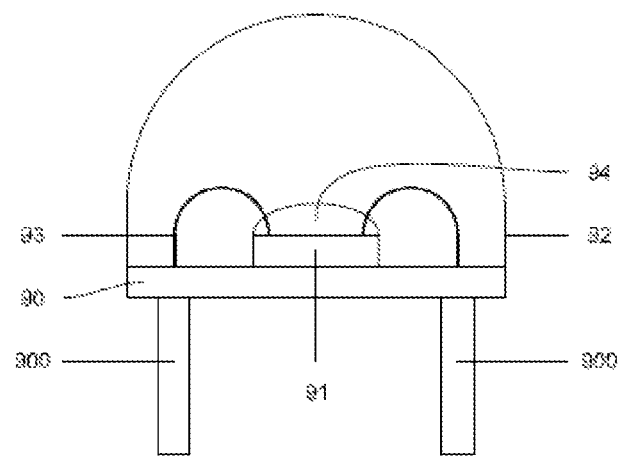
FIG. 8 is a schematic side view of a conventional LED package.
Figure 9:
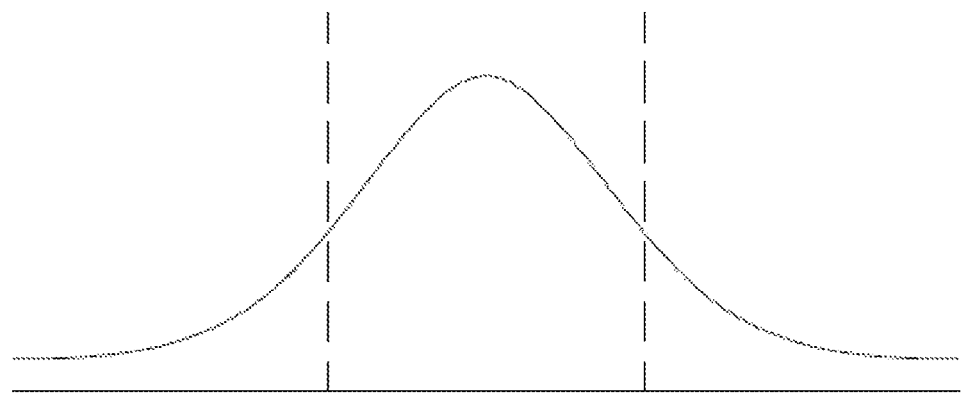
FIG. 9 is a schematic diagram showing a bin distribution of LED chips after packaging, in which the light emitted from the LED chips have the same wavelength and the same brightness.

FIG. 7 is a schematic top partial view of a printed circuit board on which an LED die package provided with a plurality of LED dies is mounted.

As shown in FIG. 7, the electrically conductive linkers 13 of the LED dies of the LED die package are electrically connected in series on amounting surface of a printed circuit board 3 by being electrically connected to a predetermined circuit trace 30 formed beforehand on the mounting surface of the printed circuit board 3. Each of the LED dies is electrically connected in parallel to a fuse unit 4 made of $SiOH_4$. When an LED die fails to work normally and causes an open circuit, the fuse unit 4 corresponding thereto melts down due to overvoltage and is therefore short-circuited to turn into an electrically connected state. Hence, even if one of the LED dies connected in series fails to function normally, the rest of them would remain operating. The conventional problem in this respect is overcome accordingly.

Figure 6:
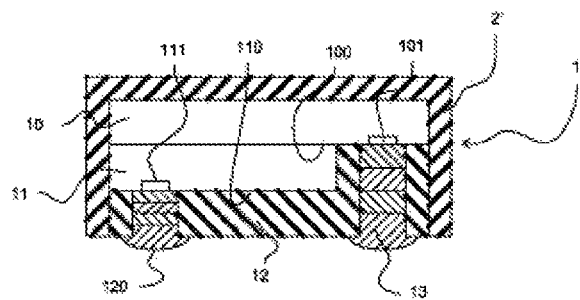

It should be noted that the circuit trace 30 can be formed by applying an electrically conductive adhesive, such as a silver paste, or by plating copper onto the board. While FIG. 7 shows a printed circuit board on which an LED die package provided with a plurality of LED dies is mounted, it should be understood that an LED die package contains only a single LED die as shown in FIG. 6 can be mounted onto a printed circuit board by a similar manner to that described above.

Preferably, the amount of the LED dies connected in series as shown in FIG. 7 is from 2 to 48 in the case where the incoming power of 110V AC is converted to 156V DC, or from 49 to 90 in the case where the incoming power of 220V AC is converted to 360V DC.

Figure 10:
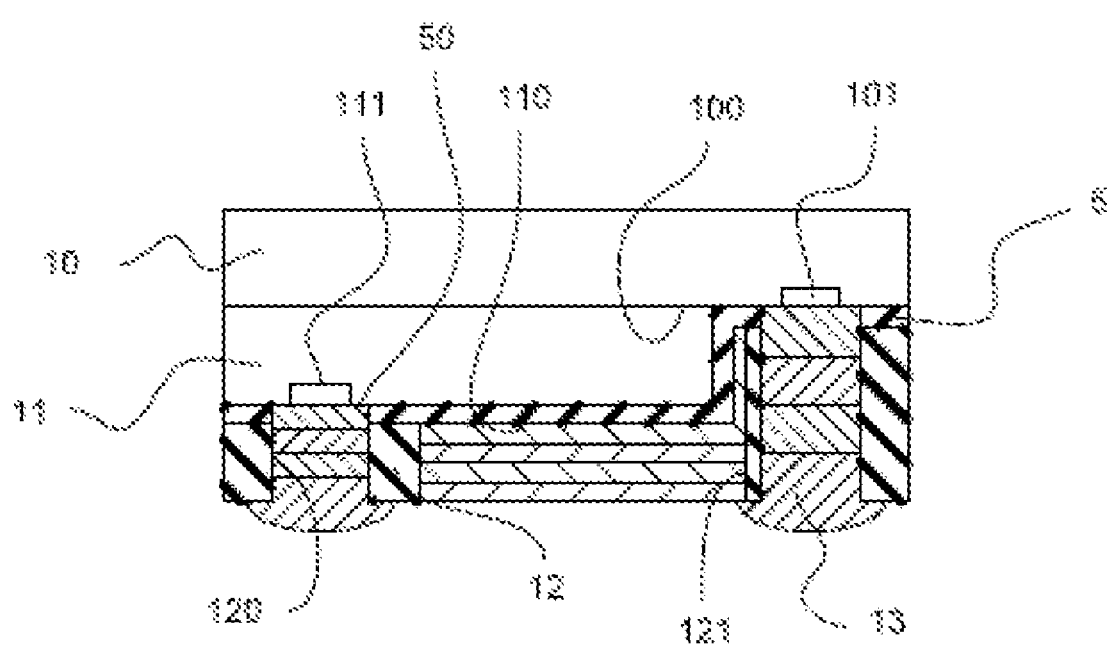
FIG. 10 is a schematic cross-sectional view of an LED die package according to another preferred embodiment of the invention.

Now referring to FIG. 10, it shows an LED die package according to another preferred embodiment of the invention. Contrary to the first preferred embodiment, this embodiment is featured by forming a buffer layer 5 on the surfaces 100, 110 of the first doped layer 10 and the second doped layer 11, before the formation of the insulation layer 12. The buffer layer 5 is then subjected to exposure and development processes to form through holes 50 for exposing corresponding solder pads 101,111. The insulation layer 12 is then disposed on the buffer layer 5 and, by being subjected to exposure and development processes, formed with several exposure holes 120 registered with the corresponding through holes 50 and a via hole 121 for exposing a portion of the buffer layer 5 that is located between the through holes 50. Then, the through holes 50 and the exposure holes 120 are each formed inside with an electrically conductive linker 13 for electrically connecting the electrodes 101,111 to external circuit components (not shown). Each of the electrically conductive linker 13 is preferably made of four metal layers, such as a combination of a chromium layer, a copper layer, a nickel layer and a gold layer, a combination of a silver layer, a copper layer, a nickel layer and a gold layer, or a combination of a chromium layer, a diamond-graphite film layer, a copper layer and a tin layer. It can been seen from FIG. 10 that the via hole 121 is formed inside with an electrically conductive linker 13. However, the electrically conductive linker 13 is provided within the via hole 121 for heat dissipation, rather than for connection to external circuit components.

The buffer layer 5 is provided for the purpose of buffering the stress that occurs between a thin silicon oxide layer (not shown) formed on the surfaces 100, 110 of the doped layers 10, 11 and the heat-dissipating conductor 13 located within the through holes 50.

In conclusion, the LED die package and the method for producing the same as disclosed herein can surely achieve the intended objects and effects of the invention by virtue of the structural arrangements and operating steps described above.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit of the invention and the scope thereof as defined in the appended claims.

What is claimed is:

1. A light-emitting diode die package, comprising:
a light-emitting diode die having a first doped layer doped with a p- or n-type dopant and a second doped layer doped with a different dopant from that doped in the first doped layer and disposed on the first doped layer, wherein each of the second doped layer and the first doped layer has an electrode-forming surface formed with an electrode, on which a buffer layer is formed, and wherein the buffer layer is formed with a plurality of through holes for exposing the electrodes corresponding thereto;
an insulation layer formed on the buffer layer, wherein the insulation layer is formed with a plurality of exposure holes, each being registered with the through holes corresponding thereto, and at least one via hole for exposing a portion of the buffer layer that is exposed by the through holes, and wherein the through holes and the exposure holes are each formed inside with an electrically conductive linker; and
a generally basin-shaped rectangular accommodating housing made of an insulative transparent material doped with phosphor powder, the housing having an open end through which an accommodating space is accessible, wherein the light-emitting diode die is positioned within the accommodating space of the housing in such a manner that the electrically conductive linker protrudes outwardly from the accommodating space.

* * * * *